United States Patent
Tanaka

(10) Patent No.: US 8,193,041 B2
(45) Date of Patent: Jun. 5, 2012

(54) SEMICONDUCTOR DEVICE AND MANUFACTURING METHOD OF THE SAME

(75) Inventor: Shigeki Tanaka, Nanae (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 406 days.

(21) Appl. No.: 11/933,144

(22) Filed: Oct. 31, 2007

(65) Prior Publication Data

US 2008/0105959 A1 May 8, 2008

(30) Foreign Application Priority Data

Nov. 2, 2006 (JP) ................................. 2006-298433

(51) Int. Cl.
*H01L 21/00* (2006.01)

(52) U.S. Cl. ............ 438/123; 438/51; 438/64; 257/674; 257/692; 257/E25.004; 257/E23.047; 257/E21.506

(58) Field of Classification Search .................. 438/123, 438/124; 257/667, 669, 692, 696, 735, 739, 257/E23.014, E23.039, E23.043, E23.045–E23.048, 257/E23.05, 674, 676
See application file for complete search history.

(56) References Cited

U.S. PATENT DOCUMENTS

| | | | |
|---|---|---|---|
| 7,791,180 B2 | 9/2010 | Shirasaka | |
| 2004/0103530 A1* | 6/2004 | Adachi et al. | 29/854 |
| 2006/0087006 A1* | 4/2006 | Shirasaka et al. | 257/619 |
| 2006/0185452 A1* | 8/2006 | Shirasaka et al. | 73/866.5 |
| 2006/0194362 A1* | 8/2006 | Shirasaka | 438/48 |
| 2007/0220988 A1* | 9/2007 | Shirasaka | 73/754 |

FOREIGN PATENT DOCUMENTS

| | | |
|---|---|---|
| JP | 2006-100348 A | 4/2006 |
| JP | 2006-108252 A | 4/2006 |
| WO | WO 2006038564 A1 * | 4/2006 |

OTHER PUBLICATIONS

Office Action from Japanese Patent Application 2006-298433.

* cited by examiner

*Primary Examiner* — Minh-Loan T Tran
*Assistant Examiner* — Leslie Pilar Cruz
(74) *Attorney, Agent, or Firm* — Miles & Stockbridge P.C.

(57) ABSTRACT

The yield of a semiconductor device is improved. Inside the resin sealing body which forms a semiconductor device, the semiconductor chip is sealed in the state where it has arranged aslant to the upper and lower sides of a resin sealing body. In the suspension lead which supports the die pad carrying this semiconductor chip, the small recess is formed in the fifth surface of the opposite side with the surface on which the semiconductor chip was mounted. This recess is a portion used as the starting point when making die pad 2a slanting. The side surface of the side near a die pad between two side surfaces of this recess is formed in the state where it inclined rather than the side surface of the side near the periphery of a resin sealing body.

9 Claims, 11 Drawing Sheets

SEMICONDUCTOR DEVICE AND MANUFACTURING METHOD OF THE SAME

CROSS-REFERENCE TO RELATED APPLICATION

The present application claims priority from Japanese patent application No. 2006-298433 filed on Nov. 2, 2006, the content of which is hereby incorporated by reference into this application.

FIELD OF THE INVENTION

The present invention relates to a semiconductor device, and the manufacturing technology of a semiconductor device, and particularly relates to the semiconductor device technology of having the structure which is sealing the semiconductor chip inside the resin sealing body in the state of slant.

DESCRIPTION OF THE BACKGROUND ART

For example, among the semiconductor devices which form a physical quantity sensor like a magnetometric sensor or an acceleration sensor, there is a semiconductor device of structure of sealing the semiconductor chip for sensors inside a resin sealing body in the state of slant in order to detect the direction in three dimensional space, and acceleration.

About such a semiconductor device, Japanese patent laid-open No. 2006-100348 (refer to Patent Reference 1) has a description, for example. The structure which sets up a stage part aslant in the case of the step which installs the lead frame in a metal mold after mounting a semiconductor chip in the stage part of a lead frame is disclosed by it.

[Patent Reference 1] Japanese patent laid-open No. 2006-100348

SUMMARY OF THE INVENTION

However, when the present inventor examined the semiconductor device of structure of accommodating a semiconductor chip in the state where it was made slanting, it was found out that the following problems existed.

In the semiconductor device which the present inventor examined, the recess is formed in the back surface of the tab suspension lead which supports the tab on which a semiconductor chip is mounted by coining etc. This recess is a portion which constitutes a starting point when making a tab slanting.

Here, since it will become difficult to pull apart the forming mold for coining from a tab suspension lead and productive capacity will decline when this recess is made deep too much, it cannot be made too much deep. However, when a recess is shallow, the mold resin portion in the recess position of the back surface of a tab suspension lead will become thin. The mold resin portion will be removed at the time of deflash, and a part of tab suspension lead will be exposed. As a result, metal plating adheres to the exposed tab suspension lead portion against a design at the time of subsequent plating treatment. There is a problem that the yield of a semiconductor device falls because poor plating adhesion (external appearance failure) occurs or a crack occurs in mold resin by setting the metal plating layer as a reason by this.

Then, a purpose of the present invention is to offer the technology which can improve the yield of a semiconductor device.

The above-described and the other purposes and novel features of the present invention will become apparent from the description herein and accompanying drawings.

Of the inventions disclosed in the present application, typical ones will next be summarized briefly.

That is, the present invention is provided with the semiconductor chip sealed in the state of slant to the mounting surface of a resin sealing body inside the resin sealing body, the recess is formed in the mounting surface side in the support lead which supports the chip mounting part which mounts the semiconductor chip, and the side surface which is located in the chip mounting part side between two side surfaces of the recess is formed in the state inclining rather than the side surface of the other of the recess.

Advantages achieved by some of the most typical aspects of the invention disclosed in the present application will be briefly described below.

That is, the yield of a semiconductor device can be improved by forming the side surface which is located in the chip mounting part side between two side surfaces of the recess formed in the support lead, in the state where it inclined rather than the side surface of the other of the recess.

DETAILED DESCRIPTION OF THE PREFERRED EMBODIMENTS

Figure 1:
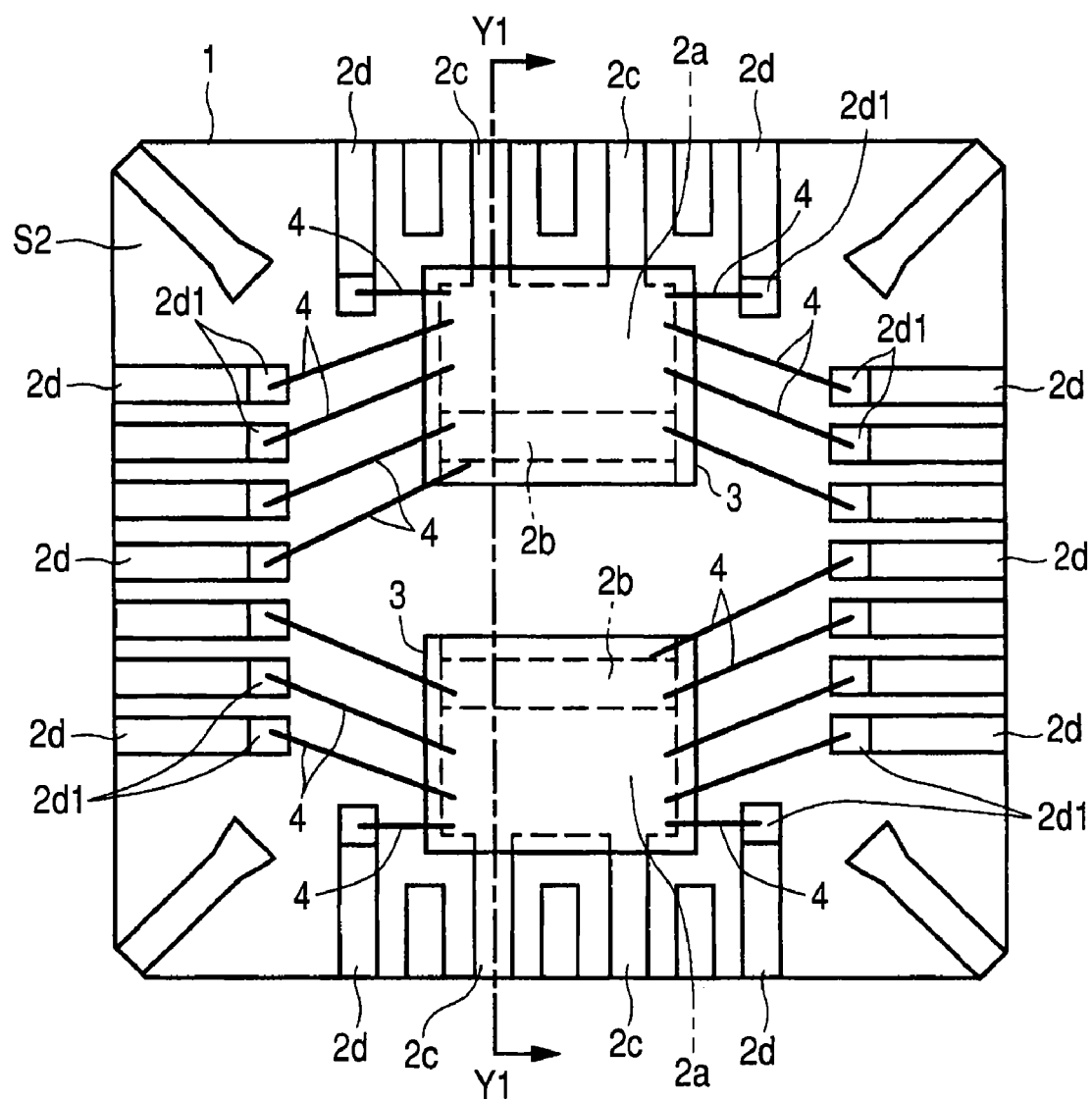
FIG. 1 is the whole upper surface plan view of the semiconductor device which is the 1 embodiment of the present invention.

In the below-described embodiments, a description will be made after divided into plural sections or in plural embodiments if necessary for convenience sake. These plural sections or embodiments are not independent each other, but in relation such that one is a modification example, details or complementary description of a part or whole of the other one unless otherwise specifically indicated. And, in the below-described embodiments, when a reference is made to the number of elements (including the number, value, amount and range), the number is not limited to a specific number but may be equal to or greater than or less than the specific number, unless otherwise specifically indicated or principally apparent that the number is limited to the specific number. Further, in the below-described embodiments, it is needless to say that the constituting elements (including element steps) are not always essential unless otherwise specifically indicated or principally apparent that they are essential. Similarly in the below-described embodiments, when a reference is made to the shape or positional relationship of the constituting elements, that substantially analogous or similar to it is also embraced unless otherwise specifically indicated or principally apparent that it is not. This also applies to the above-described value and range. And, in all the drawings for describing the embodiments, members of a like function will be identified by like reference numerals and overlapping descriptions will be omitted as much as possible. Hereafter, embodiments of the invention are explained in detail based on drawings.

Figure 2:
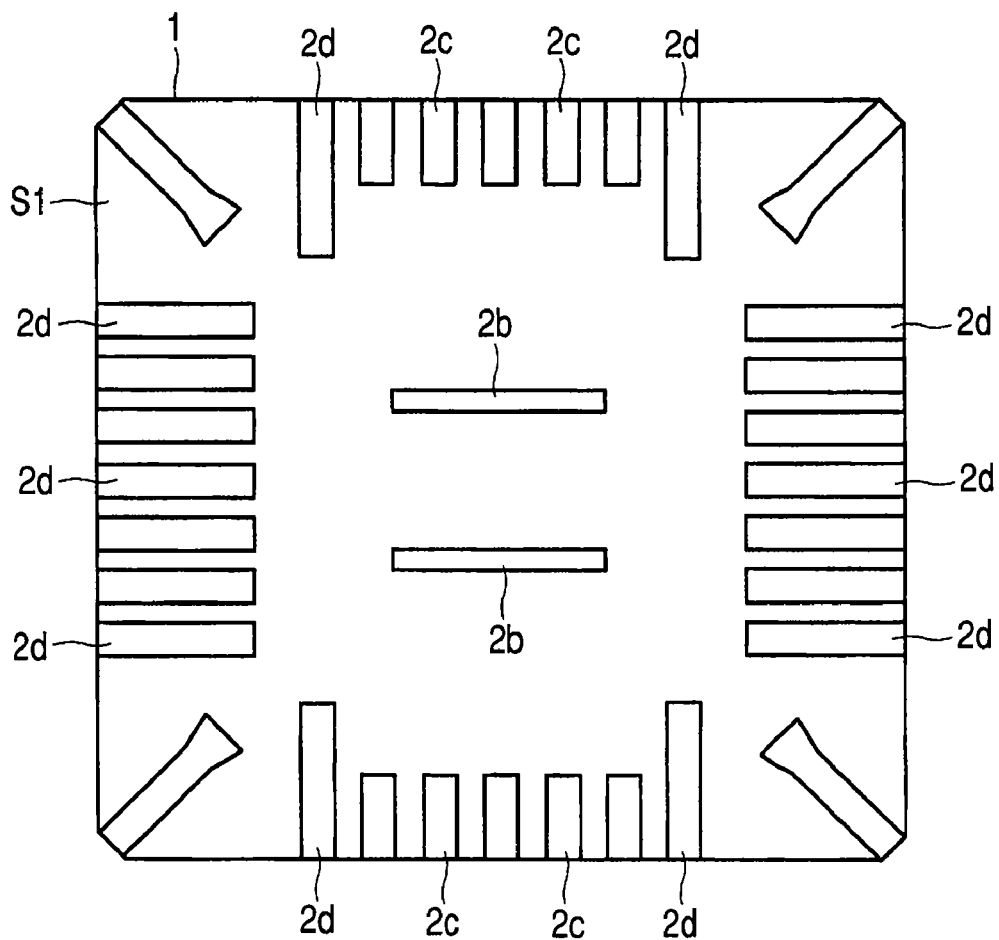
FIG. 2 is the whole under surface plan view of the semiconductor device of FIG. 1.
Figure 3:
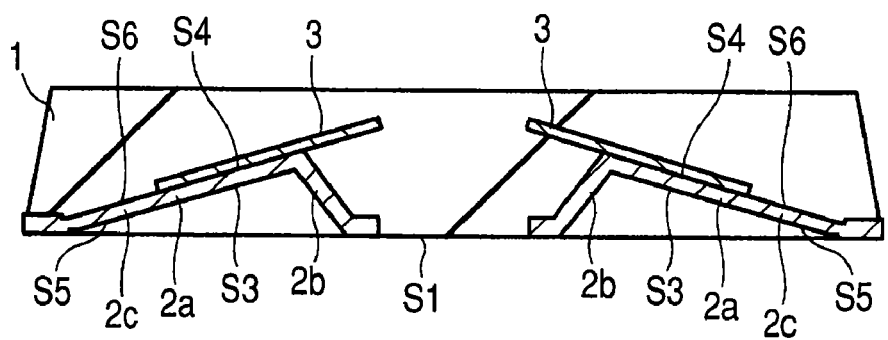
FIG. 3 is a cross-sectional view of Y1-Y1 line of FIG. 1.
Figure 4:
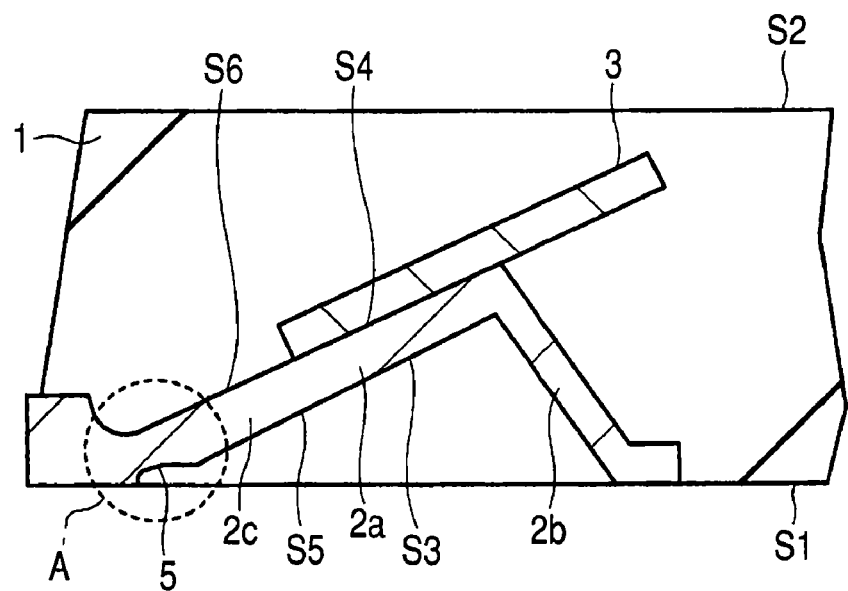
FIG. 4 is a principal part enlarged sectional view of the semiconductor device of FIG. 3.
Figure 5:
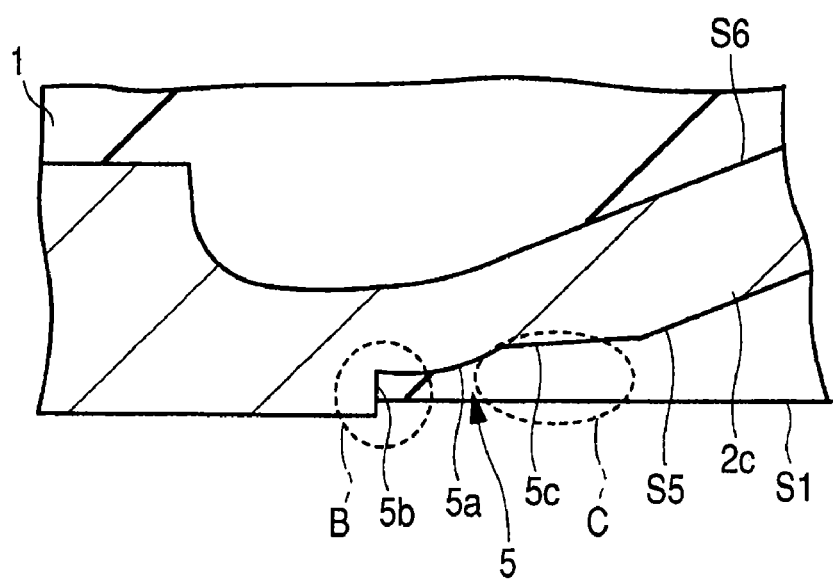
FIG. 5 is an enlarged sectional view of region A of FIG. 4.
Figure 6:
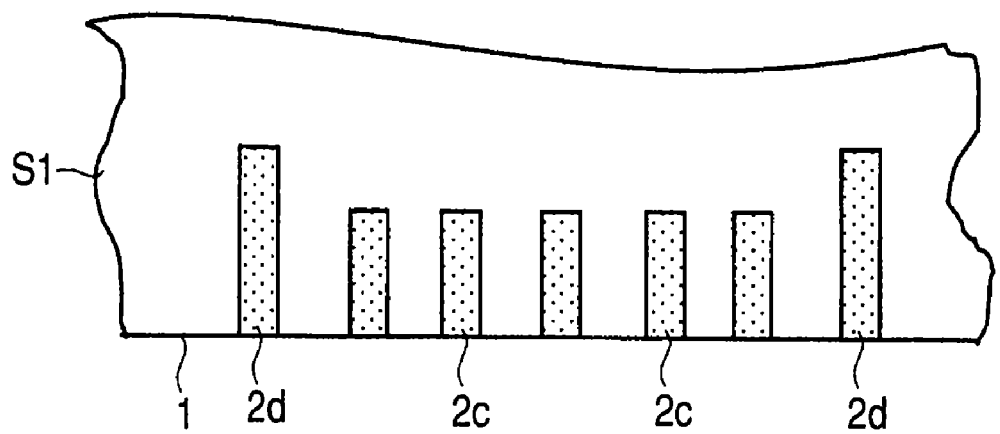
FIG. 6 is a principal part enlarged plan view of the under surface of the semiconductor device of FIG. 1.

FIG. 1 is the whole upper surface plan view of the semiconductor device of this embodiment, and FIG. 2 is the whole under surface plan view of the semiconductor device of FIG. 1. FIG. 3 is a cross-sectional view of Y1-Y1 line of FIG. 1, FIG. 4 is a principal part enlarged sectional view of the semiconductor device of FIG. 3, FIG. 5 is an enlarged sectional view of region A of FIG. 4, and FIG. 6 is a principal part enlarged plan view of the under surface of the semiconductor device of FIG. 1. In FIG. 1, in order to make a drawing legible, the inside of a semiconductor device is looked through.

The semiconductor device of this embodiment is set, for example as QFN (Quad Flat Non leaded Package) structure. Resin sealing body 1 which forms the package of this semiconductor device is formed in the thin plate state of a plane quadrangle, for example with epoxy system resin, and has first surface S1 (mounting surface) and second surface S2 which are mutually located in the opposite side along a thickness direction. First surface S1 of resin sealing body 1 is equivalent to the under surface (mounting surface) of a semiconductor device, and second surface S2 of resin sealing body 1 is equivalent to the upper surface of a semiconductor device.

Inside this resin sealing body 1, two die pads (chip mounting part) 2a, a part of slope regulation lead 2b, a part of suspension lead (support lead) 2c, a part of a plurality of leads 2d, two semiconductor chips 3, and a plurality of bonding wires (only henceforth a wire) 4 are sealed.

Each die pad 2a has third surface S3 and fourth surface S4 which are mutually located in the opposite side along a thickness direction. Each die pad 2a is formed in the state where it inclined to first surface S1 and second surface S2 of resin sealing body 1. That is, each die pad 2a is formed in the state where it inclined so that it might become low gradually from the center of resin sealing body 1 toward a periphery.

The above-mentioned slope regulation lead 2b is formed into one in one side of the side which faces mutually of each die pad 2a. This slope regulation lead 2b is a portion which contributes to an inclination setup of die pad 2a, and has bent in the direction (third surface S3 side) which crosses to third surface S3 and fourth surface S4 of die pad 2a. With the length and the bending angle of this slope regulation lead 2b, the angle of gradient of die pad 2a and semiconductor chip 3 is decided. The part at the side of the tip of slope regulation lead 2b is exposed from first surface S1 of resin sealing body 1.

In each die pad 2a, two suspension leads 2c are connected to other one side in one. This suspension lead 2c has fifth surface S5 and sixth surface S6 which are mutually located in the opposite side along a thickness direction. The end portion of suspension lead 2c is exposed from first surface S1, and the side surface which intersects this of resin sealing body 1. The plated layer which consists of silver (Ag) plating, for example is formed in the portion where this suspension lead 2c exposes from first surface S1 of resin sealing body 1.

In fifth surface S5 of this suspension lead 2c, rather than die pad 2a, as shown in FIG. 4 and FIG. 5, small recess 5 which becomes depressed in the thickness direction of suspension lead 2c is formed in the position near the periphery of seal resin body 1 so that the extending direction of suspension lead 2c may be crossed.

This recess 5 has bottom 5a, and two side surfaces 5b and 5c which intersect bottom 5a, and fifth surface S5 of suspension lead 2c, as shown in FIG. 5. This recess 5 (corner especially formed in recess 5 on side surface 5b at the side of the periphery of resin sealing body 1 and bottom 5a) is a portion used as the starting point when bending suspension lead 2c, in order to make die pad 2a incline.

In this embodiment, side surface 5c which is located in the die pad 2a side between two side surfaces 5b and 5c of this recess 5 is formed in the state where it inclined rather than side surface 5b at the side of the periphery of seal resin body 1 of recess 5. That is, side surface 5b of recess 5 intersects the right angle (on a design) to fifth surface S5 of suspension lead 2c. Hereby as shown in region B of FIG. 5, the exposing portion and coating part of suspension lead 2c can be clarified. On the other hand, side surface 5c which is located in the die pad 2a side of recess 5 crosses in the state where it inclined to fifth surface S5 of suspension lead 2c so that it might become a forward tapered shape. Hereby as shown in region C of FIG. 5, the thickness of resin sealing body 1 portion under side surface 5c of recess 5 is fully securable. This forward tapered shape says the state where side surface 5c inclines so that the area of recess 5 may become large as it separates from bottom 5a of recess 5 in the direction which intersects perpendicularly with the bottom 5a.

A plurality of leads 2d are formed in the circumference of each die pad 2a. These leads 2d of a plurality of are electrically connected with the above-mentioned semiconductor chip 3 through wire 4. On the each lead 2d upper surface, plated layer 2d1 which for example, consists of silver (Ag) is partially formed in the point at the side of semiconductor chip 3. The second bonding part of the above-mentioned wire 4 is joined to the portion in which this plated layer 2d1 was formed. In an under surface and a side surface of lead 2d, the other end part at the side of resin sealing body 1 is exposed from first surface S1, and the side surface which intersects this of resin sealing body 1.

Above die pad 2a, slope regulation lead 2b, suspension lead 2c, and lead 2d are formed with metal, such as for example, copper (Cu) or 42 alloy.

The above-mentioned semiconductor chip 3 consists of for example, a semiconductor thin plate of the plane quadrangular shape formed with silicon (Si), and where it turned the main surface upwards and the back surface is turned to die pad 2a, it is being pasted up and fixed to fourth surface S4 of die pad 2a. Here, the case where two semiconductor chips 3 are accommodated in one semiconductor device is exemplified. The plane area of each semiconductor chip 3 is larger than the plane area of die pad 2a, and where the periphery of semiconductor chip 3 has protruded from the periphery of die pad 2a, it is mounted on die pad 2a.

Physical quantity sensors, such as for example, a magnetometric sensor, an acceleration sensor, etc., are formed in the main surface of this semiconductor chip 3. This semiconductor chip 3 (and die pad 2a) is sealed inside resin sealing body 1 in the state of slant to first surface S1 and second surface S2 of resin sealing body 1, in order to detect the direction and acceleration in three dimensional space. That is, two semiconductor chips 3 are sealed inside resin sealing body 1 in the state where it inclined so that it might fall gradually toward a periphery from the center of resin sealing body 1.

Near the main surface periphery of semiconductor chip 3, along the main surface periphery a plurality of bonding pads (only henceforth a pad) are located in a line, and are arranged. While this pad is electrically connected to the above-mentioned physical quantity sensor of the main surface of semiconductor chip 3, the first bonding part of the above-mentioned wire 4 is electrically connected.

Next, after FIG. 7-FIG. 10 explain the problem of the semiconductor device which the present inventor examined, the effect of the semiconductor device explained by FIG. 1-FIG. 6 is explained.

Figure 7:
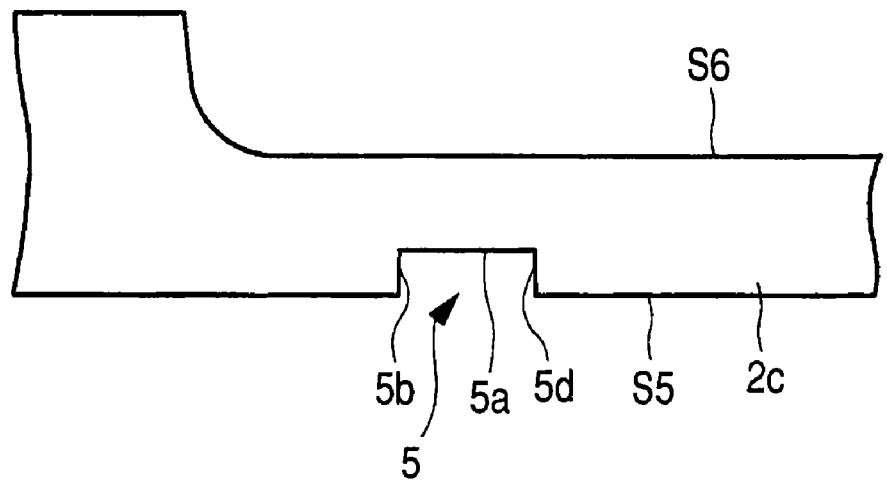
FIG. 7 is an expansion side view of a recess portion before the bending step of the suspension lead of the semiconductor device which the present inventor examined.

FIG. 7 shows the expansion side view of recess 5 portion before the bending step of suspension lead 2c of the semiconductor device which the present inventor examined. In the technology which the present inventor examined, side surface 5b at the side of a resin sealing body periphery and side surface 5d at the side of a die pad of recess 5 of suspension lead 2c before a bending step are both formed so that it may intersect perpendicularly to fifth surfaces S5 of suspension lead 2c. In this case, when recess 5 is made too much deep, the problem of being unable to pull apart well the metallic mold for the recessed parts forming from suspension lead 2c, or suspension lead 2c deforming by being pulled away forcibly will occur after formation of recess 5. The above problems will become remarkable when suspension lead 2c (lead frame) becomes still thinner with the request of the size and weight reduction of a semiconductor device. For this reason, in the case of recess 5 of FIG. 7, it cannot but form shallowly.

Figure 8:
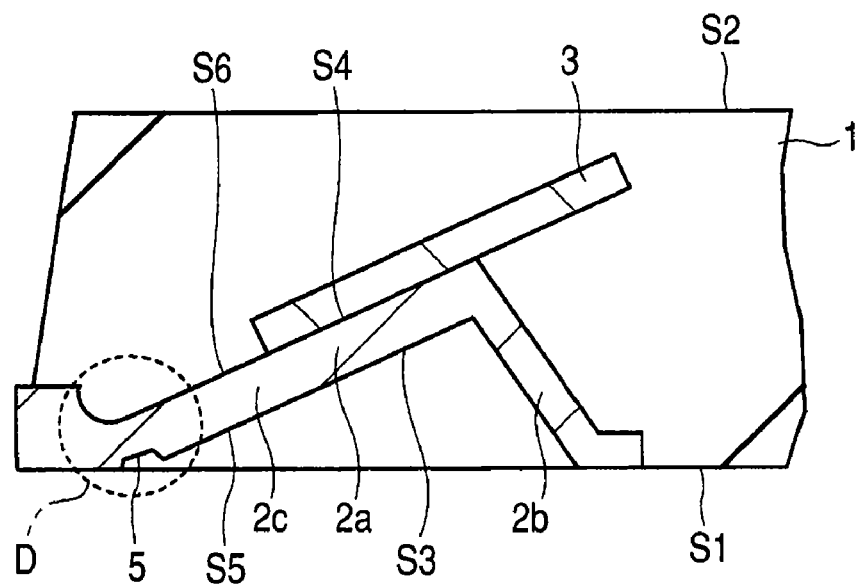
FIG. 8 is a principal part enlarged sectional view of the semiconductor device after sealing a semiconductor chip after the bending step of the suspension lead of FIG. 7.
Figure 9:
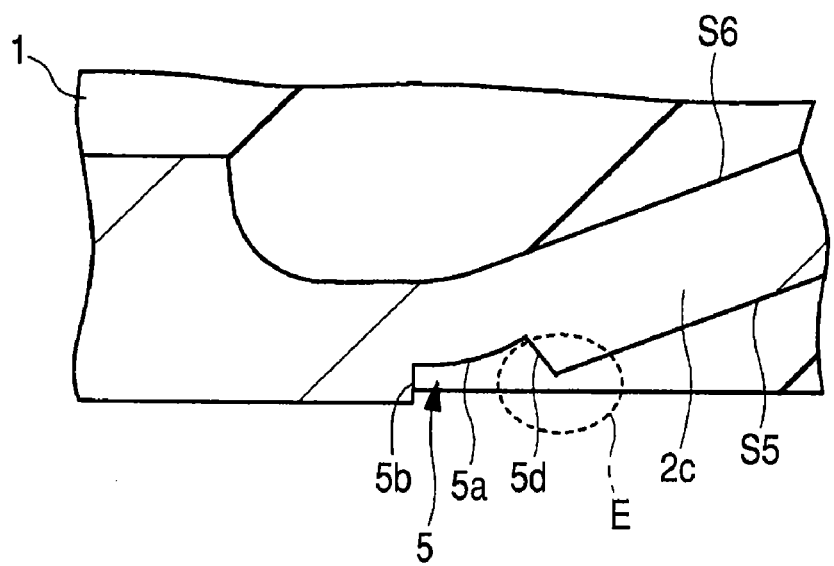
FIG. 9 is an enlarged sectional view of region D of FIG. 8.
Figure 10:
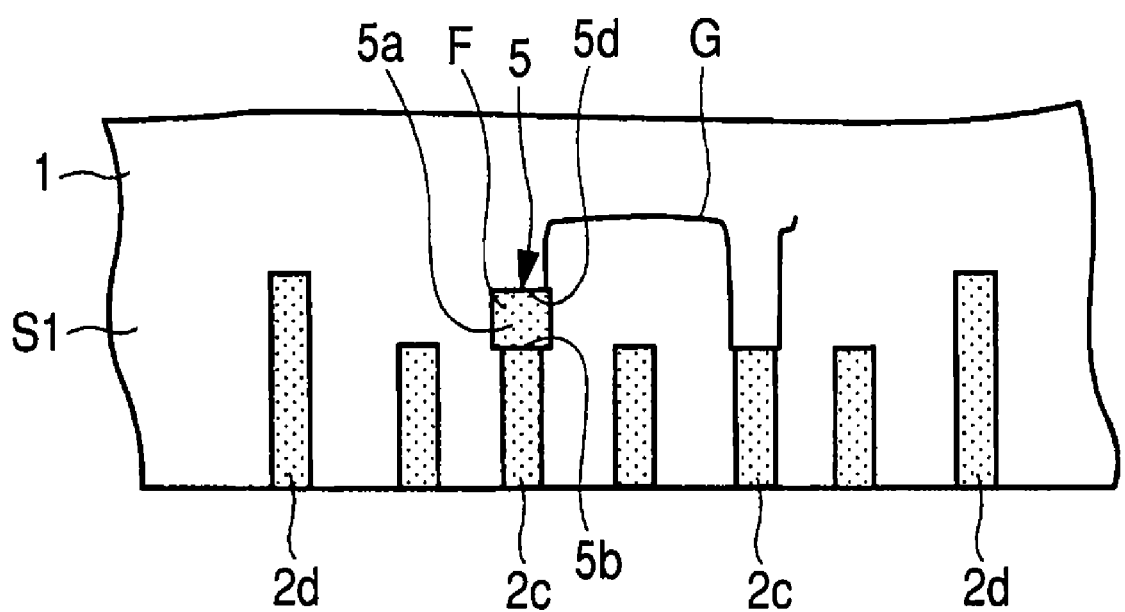
FIG. 10 is a principal part enlarged plan view of the first surface of the resin sealing body of the semiconductor device of FIG. 8.

Next, FIG. 8 shows the principal part enlarged sectional view of the semiconductor device after sealing semiconductor chip 3 after the bending step of suspension lead 2c of the above-mentioned FIG. 7, FIG. 9 shows the enlarged sectional view of region D of FIG. 8, and FIG. 10 shows the principal part enlarged plan view of first surface S1 of resin sealing body 1 of the semiconductor device of FIG. 8.

Although recess 5 must be made shallow in the above-mentioned structure of FIG. 7, as shown in FIG. 8 and FIG. 9 in the case, resin sealing body 1 portion under recess 5 becomes thin. In particular, thickness of resin sealing body 1 portion cannot fully be secured to the part of region E of FIG. 9, i.e., the bottom of the corner where side surface 5d at the side of the die pad of recess 5 and fifth surface S5 of suspension lead 2c intersect. For this reason, the resin sealing body 1 thin portion will peel at the time of deflash (water washing). As a result, as shown in FIG. 10 when plating treatment is performed to the exposed surface of lead 2d and suspension lead 2c, the problem that a plated layer is formed in part F in which a plated layer should not originally be formed of suspension lead 2c, or crack G enters into resin sealing body 1 by formation of a plated layer contrary to the design occurs. As a result, there is a problem that the yield of a semiconductor device falls.

On the other hand, since mold release of the metallic mold for recessed parts forming can be made easy by having made side surface 5c at the side of die pad 2a of recess 5 of suspension lead 2c incline according to the semiconductor device of this embodiment explained using FIG. 1-FIG. 6, recess 5 can be formed deeply. By having made side surface 5c at the side of die pad 2a of recess 5 of suspension lead 2c incline, the distance from the corner where side surface 5c after the bending step of suspension lead 2c and fifth surface S5 of suspension lead 2c intersect to the upper surface of the lower die of a metal mold can be made longer than the case where FIG. 8 and FIG. 9 show. The thickness of resin sealing body 1 portion near the recess 5 is fully securable with these. For this reason, the trouble that resin sealing body 1 portion near the recess 5 will peel at the time of deflash (water washing) can be reduced or prevented. Therefore, since the problem that a plated layer is formed in part F in which a plated layer should not originally be formed of suspension lead 2c, and crack G enters into resin sealing body 1 by formation of a plated layer contrary to the design can be reduced or prevented, the yield of a semiconductor device can be improved.

Side surface 5b at the side of the periphery of resin sealing body 1 of recess 5 was made to become a right angle (relatively acute angle) to fifth surface S5 of suspension lead 2c. Hereby as shown in region B of FIG. 5, the flash (resin burr) of resin sealing body 1 at the side of the side surface 5b can be reduced or prevented, the boundary of the exposed part and covering part of suspension lead 2c can be clarified, and the yield of a semiconductor device can be improved.

Figure 11:
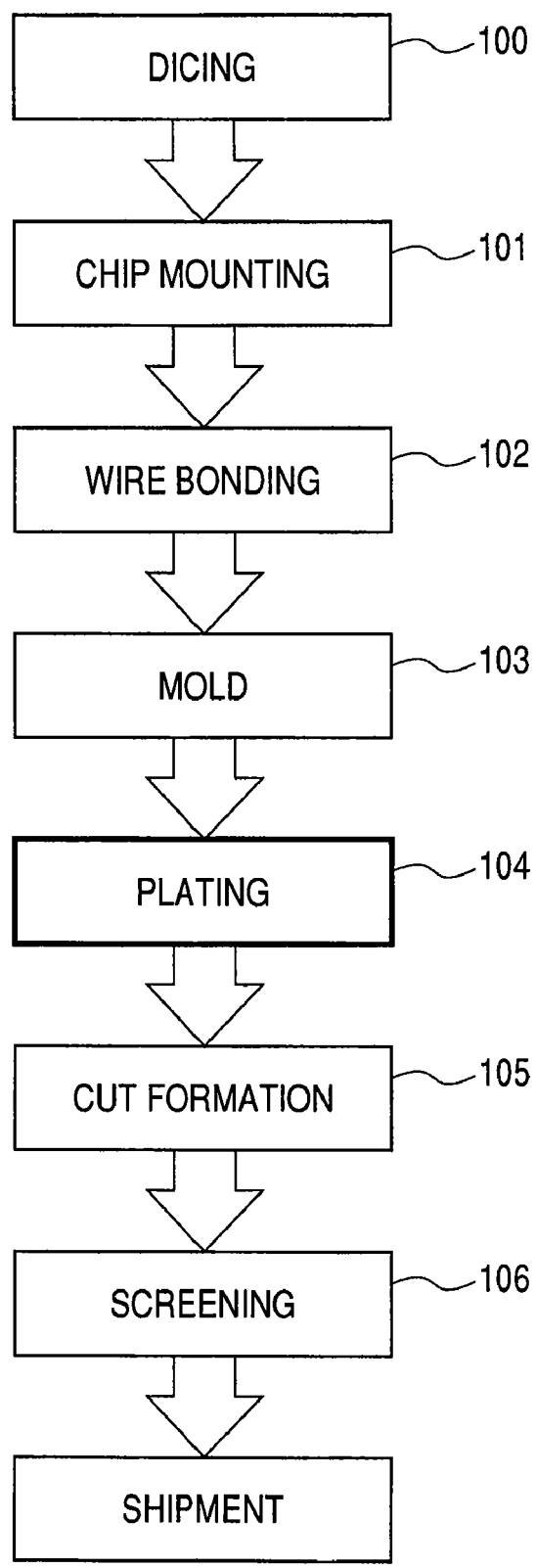
FIG. 11 is a manufacturing flow picture of the semiconductor device which is the 1 embodiment of the present invention.

Next, an example of the manufacturing method of the semiconductor device of this embodiment is explained along with the flow diagram of FIG. 11 using FIG. 12-FIG. 19.

First, a semiconductor wafer is divided into a plurality of semiconductor chips by performing dicing processing to the semiconductor wafer to which the wafer process (preceding process) ended (step 100 of FIG. 11). A semiconductor wafer consists of a semiconductor thin plate of the plane almost circle configuration which consists of for example, a silicon (Si) single crystal, and the above-mentioned physical quantity sensor is formed in the main surface of each semiconductor chip.

Figure 12:
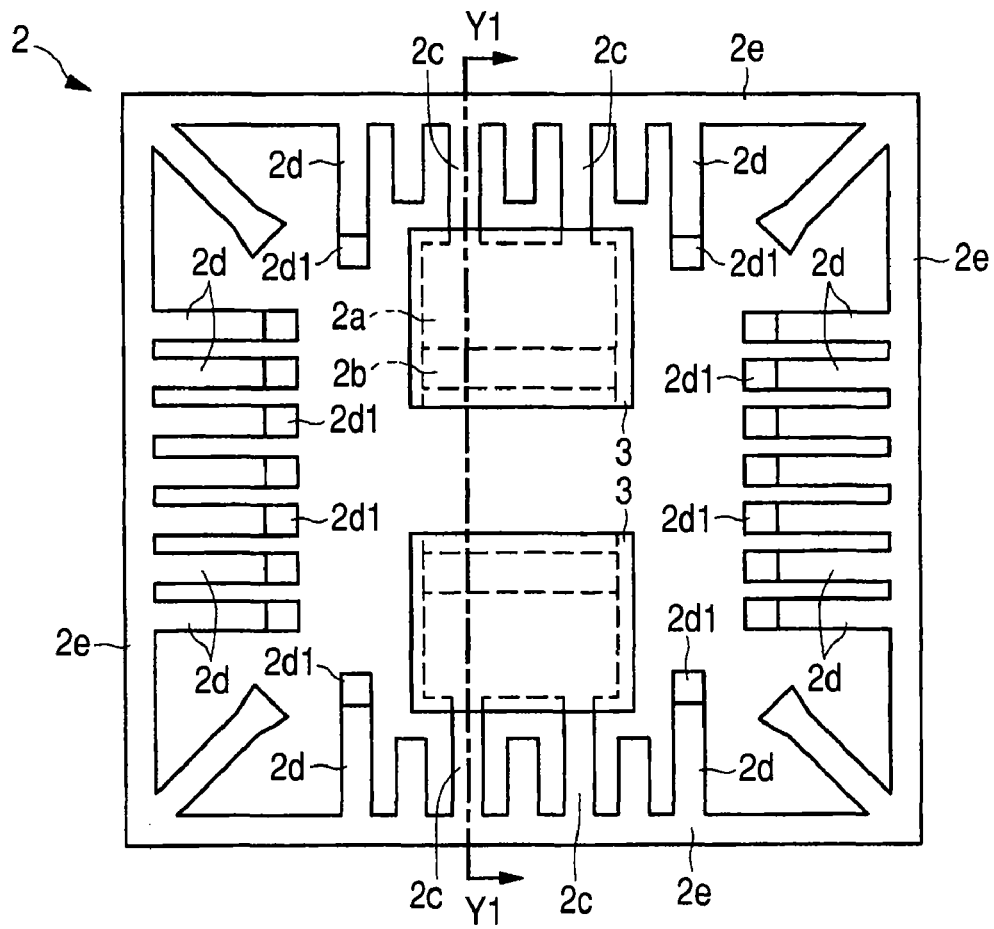
FIG. 12 is a plan view of the unit region of the lead frame after a chip mounting step.
Figure 13:
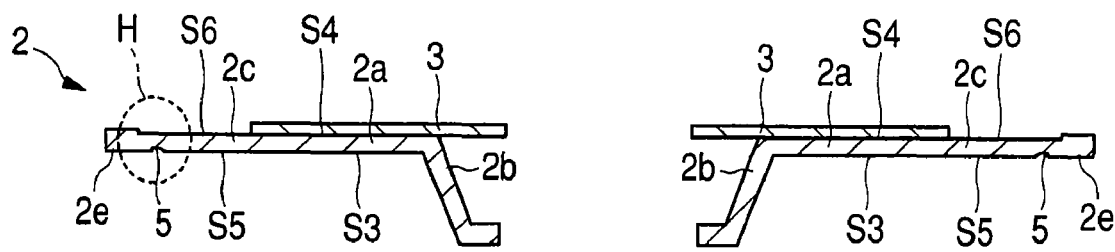
FIG. 13 is an enlarged sectional view of Y1-Y1 line of FIG. 12.
Figure 14:
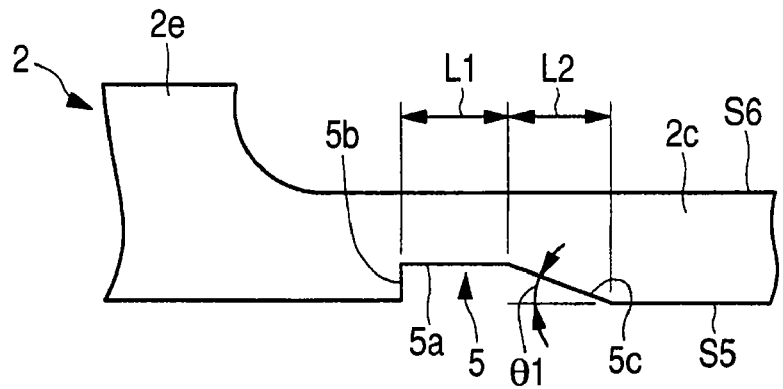
FIG. 14 is an expansion side view of region H of FIG. 13.

Then, as shown in FIG. 12 and FIG. 13, the above-mentioned semiconductor chip 3 is mounted on die pad (a chip mounting part, a tab) 2a of lead frame 2 (step 101 of FIG. 11). FIG. 12 is a plan view of the unit region of lead frame 2 after a chip mounting step, and FIG. 13 is an enlarged sectional view of Y1-Y1 line of FIG. 12. FIG. 14 is an expansion side view of region H of FIG. 13.

The above-mentioned lead frame 2 consists of a metallic thin plate which consists of for example, copper (Cu) or 42 alloy etc., and has the upper surface and the under surface which are mutually located in the opposite side along a thickness direction.

In the upper and lower sides of this lead frame 2, a plurality of unit regions are arranged at a single tier or matrix form. In each unit region of this lead frame 2, two die pads 2a, slope regulation lead 2b formed in one at the tip of the side which faces mutually of each die pad 2a, two suspension leads 2c which support each die pad 2a, a plurality of leads 2d arranged around two die pads 2a, and frame part 2e which supports a plurality of above-mentioned leads 2d and suspension lead 2c are formed in one.

Third surface S3 of each die pad 2a is a part of under surface of lead frame 2, and fourth surface S4 of die pad 2a is a part of upper surface of lead frame 2. Each die pad 2a is connected to frame part 2e in one through two suspension leads 2c connected to the each one side in one. Hereby each die pad 2a is supported by lead frame 2.

Die pad 2a of this stage is flat, without inclining to the upper and lower sides of lead frame 2.

Fifth surface S5 of the above-mentioned suspension lead 2c is a part of under surface of lead frame 2, and sixth surface S6 of suspension lead 2c is a part of upper surface of lead frame 2. In fifth surface S5 of this suspension lead 2c, the above-mentioned small recess 5 which becomes depressed in the thickness direction of suspension lead 2c is formed in the position near frame part 2e rather than die pad 2a, so that the extending direction of suspension lead 2c may be crossed.

In this embodiment, as shown in FIG. 14, in this recess 5, side surface 5c which is located in the die pad 2a side between two side surfaces 5b and 5c which intersect fifth surface S5 of suspension lead 2c is formed in the state where it inclined rather than side surface 5b at the side of frame part 2e of recess 5. That is, side surface 5b at the side of frame part 2e of recess 5 intersects the right angle (on a design) to fifth surface S5 of suspension lead 2c. On the other hand, side surface 5c which is located in the die pad 2a side of recess 5 crosses in the state where it inclined to fifth surface S5 of suspension lead 2c so that it might become a forward tapered shape. Hereby the metallic mold for forming recess 5 can be released easily. For this reason, recess 5 can be formed deeply.

The depth of recess 5 is 15 μm~30 μm grade, for example, and is 15 μm~25 μm grade preferably. It is because when the depth of recess 5 is less than 15 μm, it will be easy to generate the problem that a part of resin sealing body peels, and on the other hand, the strength of suspension lead 2c falls and deformation and a disconnection failure occur in case of more than 25 μm.

Angle-of-gradient θ1 of side surface 5c of recess 5 is 30 degrees-40 degrees, for example. The length (size of the extending direction of suspension lead 2c) L1 of bottom 5a of recess 5 is equal to the length (size of the extending direction of suspension lead 2c) L2 of side surface 3c, for example.

Figure 15:
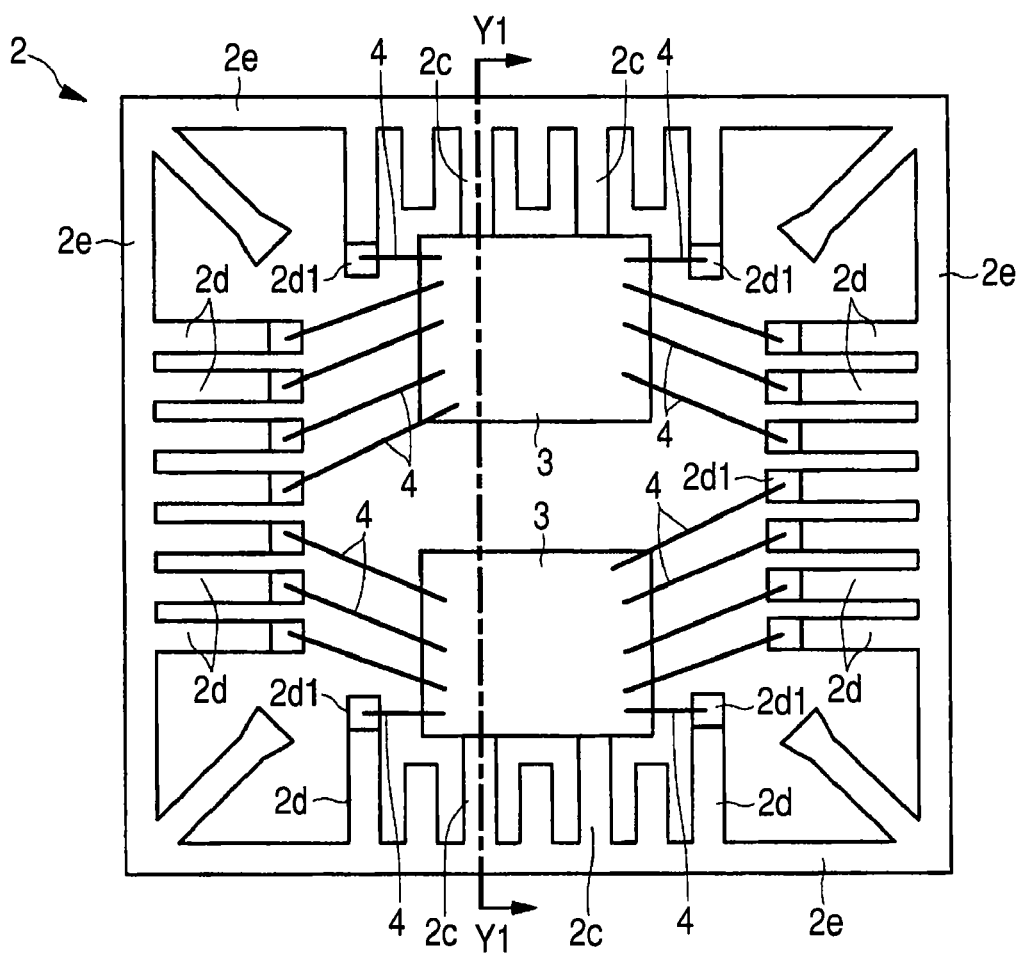
FIG. 15 is a plan view of the unit region of the lead frame after a wire-bonding step.
Figure 16:
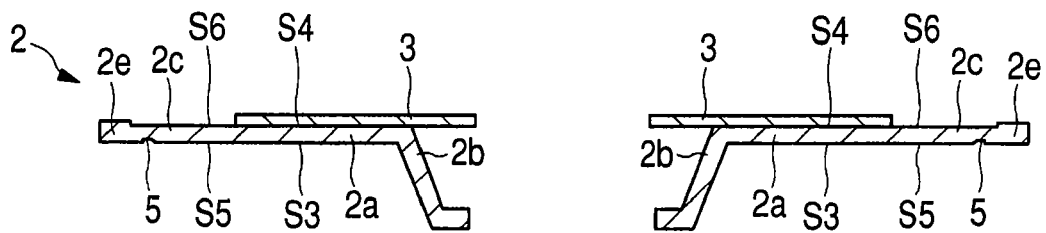
FIG. 16 is an enlarged sectional view of Y1-Y1 line of FIG. 15.

Then, as shown in FIG. 15 and FIG. 16, the pad of the above-mentioned semiconductor chip 3 and lead 2d of lead frame 2 are electrically connected with wire 4 (step 102 of FIG. 11). FIG. 15 is a plan view of the unit region of lead frame 2 after a wire-bonding step, and FIG. 16 is an enlarged sectional view of Y1-Y1 line of FIG. 15. Wire 4 is formed, for example with gold (Au). For example, bonding of the wire 4 is done by the forward bonding method. That is, one end (first bonding) of wire 4 is joined with the pad of semiconductor chip 3, and the other end (second bonding) of wire 4 is joined to plated layer 2d1 of the lead 2d tip.

Figure 17:
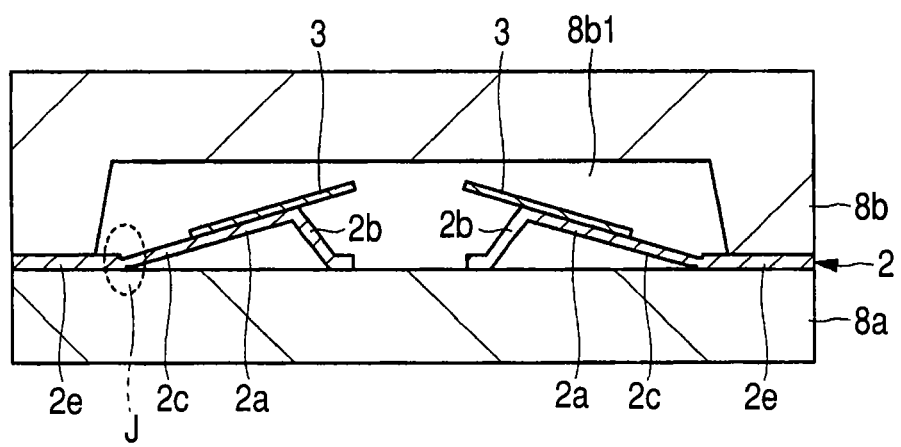
FIG. 17 is a cross-sectional view of the unit region of a lead frame and a metal mold after installing a lead frame in a metal mold.
Figure 18:
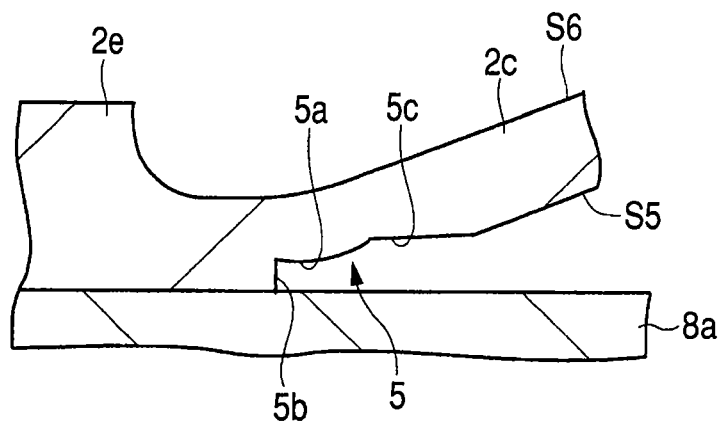
FIG. 18 is an enlarged sectional view of region J of FIG. 17.

Then, it shifts to a transfer molding step. Here, first, as shown in FIG. 17 and FIG. 18, lead frame 2 is put with first metallic mold 8a and second metallic mold 8b of a metal mold. FIG. 17 is a cross-sectional view of the unit region of lead frame 2 and a metal mold after installing lead frame 2 in a metal mold, and FIG. 18 is an enlarged sectional view of region J of FIG. 17. First metallic mold 8a is a metallic mold with the flat upper surface, and the under surface of lead frame 2 touches. Second metallic mold 8b is a metallic mold with cavity 8b1 which becomes depressed in the thickness direction, and two semiconductor chips 3, die pad 2a, etc. of a unit region of lead frame 2 are accommodated in the cavity 8b1.

When lead frame 2 is put with such first metallic mold 8a and second metallic mold 8b, slope regulation lead 2b of lead frame 2 will be pushed up above FIG. 17 by first metallic mold 8a. Hereby suspension lead 2c bends above FIG. 17 with the above-mentioned recess 5 as the starting point, and the slope regulation lead 2b side of die pad 2a goes up above FIG. 17. Hereby die pad 2a will be in the state where it inclined to the upper surface (or upper and lower sides of frame part 2e) of first metallic mold 8a.

At this time, in this embodiment, as shown in FIG. 18, the distance from the corner part where side surface 5c of recess 5 and fifth surface S5 of suspension lead 2c intersect to the upper surface of first metallic mold 8a is greatly securable by having made side surface 5c of recess 5 of suspension lead 2c incline.

Figure 19:
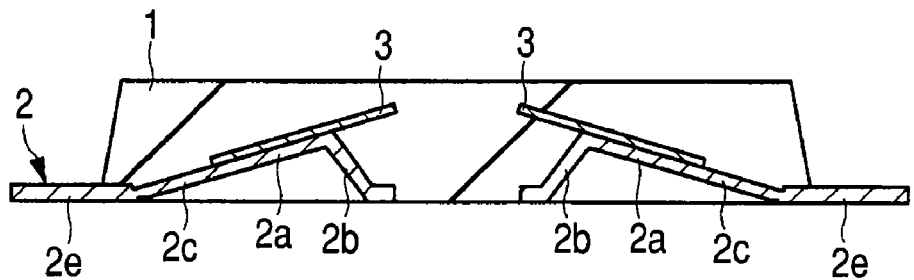
FIG. 19 is a cross-sectional view of the semiconductor device of the unit region after a molding step.

Then, by taking out from a metal mold, after pouring in epoxy system resin in cavity 8b1, for example and hardening this, as shown in FIG. 19, resin sealing body 1 is formed in each unit region. FIG. 19 is a cross-sectional view of the semiconductor device of the unit region after a molding step. Resin sealing body 1 has first surface S1 and second surface S2 which are mutually located in the opposite side along a thickness direction. Semiconductor chip 3, die pad 2a, a part of slope regulation lead 2b, a part of suspension lead 2c, a part of a plurality of leads 2d, and wire 4 are covered with resin sealing body 1 (step 103 of FIG. 11).

Subsequently after deflash (water washing) processing cleans the metal part exposed from resin sealing body 1, the plated layer which consists of silver, for example is formed in the front surface exposed from resin sealing body 1 in lead frame 2 (lead 2d) (step 104 of FIG. 11). On this occasion, in this embodiment, a part of thickness of resin sealing body 1 near the recess 5 of fifth surface S5 of tab suspension lead 2c is securable for the grade which does not peel at the time of deflash (water washing). Therefore, the problem that a part of tab suspension lead 2c will be exposed from resin sealing body 1 is avoidable. For this reason, the problem of poor plating adhesion (external appearance failure) that plating adheres against a design to a part of tab suspension lead 2c at the time of plating treatment step 104 is avoidable. The problem that a crack enters into resin sealing body 1 by setting the plated layer as a reason is avoidable. Therefore, the yield of a semiconductor device can be improved.

Then, a part of lead frame 2 is cut, and lead 2c is formed (step 105 of FIG. 11). This separates each semiconductor device from lead frame 2. Then, passing a screening step (step 106 of FIG. 11), a non defective unit is shipped.

Figure 20:
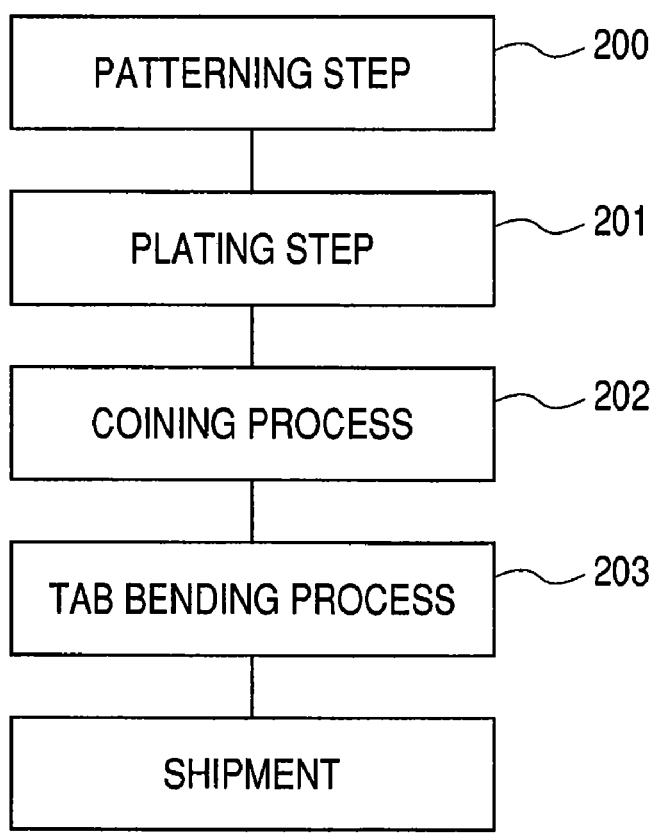
FIG. 20 is a manufacturing flow picture of a lead frame used by the manufacturing process of the semiconductor device which is the 1 embodiment of the present invention.

Next, an example of the manufacturing method of lead frame 2 shown in the above-mentioned FIG. 12 is explained along the flow diagram of FIG. 20.

First, the flat metallic thin plate which consists of for example, copper (Cu) or 42 alloy etc. is prepared, and etching processing using a resist mask is performed to this. This patterns the above-mentioned die pad 2a, slope regulation lead 2b, suspension lead 2c, a plurality of leads 2d, and frame part 2e (step 200 of FIG. 20). Slope regulation lead 2b of this stage does not incline to die pad 2a, but is flat.

Then, the plated layer which consists of for example, silver (Ag) etc. is selectively formed in the point of a plurality of leads 2d (step 201 of FIG. 20). Then, the above-mentioned recess 5 is formed in a part of fifth surface S5 of suspension lead 2c by the coining method etc. (step 202 of FIG. 20). Then, slope regulation lead 2b is bent in the direction which intersects third surface S3 of die pad 2a (tab bending step 203 of FIG. 20). Then, a test etc. is conducted and a non defective unit is shipped.

Coining process step 202 and tab bending step 203 can also be performed at one step. In that case, the metallic molds to prepare can be reduced. Machining time can be shortened. On the other hand, as mentioned above, when performing independently coining process step 202 and tab bending step 203, the bending amount of a slope regulation lead can be individually adjusted by preparing two or more kinds of metallic molds for tab bendings, and combining them. Therefore, it can deal with to manufacture of the physical quantity sensor of a plurality of specifications with which the degrees of setting angle (angle of gradient of semiconductor chip 3) differ.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

The above explanation mainly explained the case where invention made by the present inventor was applied to the manufacturing method of a magnetometric sensor or an acceleration sensor which is the utilization field used as the background. However, it is not limited to it, but is applicable to many things, and can also be applied to other sensors, for example.

The present invention is applicable to the manufacture of a semiconductor device.

What is claimed is:

1. A manufacturing method of a semiconductor device, comprising the steps of:
   (a) providing a lead frame including a chip mounting portion, a plurality of leads, and a support lead having, in cross-section, a to be covered portion connected to the chip mounting portion, a to be exposed portion, and a concave portion formed in a lower surface of the support lead between the to be covered portion and the to be exposed portion;
   (b) after the step (a), mounting a semiconductor chip on a chip mounting surface of the chip mounting portion of the lead frame, the semiconductor chip including a plurality of pads;
   (c) after the step (b), electrically connecting the plurality of pads to corresponding ones of the plurality of leads with respective wires;
   (d) after the step (c), clamping the lead frame with a first molding die and a second molding die, thereby bending the support lead at the concave portion as a starting point, thereby contacting a lower surface of the to be exposed portion of the support lead with an upper surface of the first molding die; and
   (e) after the step (d), sealing the semiconductor chip, the chip mounting portion, the to be covered portion of the support lead, and the wires with a resin such that the lower surface of the to be exposed portion of the support lead is exposed from the resin,
   wherein in the step (b), the mounting of the semiconductor chip on the chip mounting surface of the chip mounting portion of the lead frame is performed such that the concave portion does not overlap the semiconductor chip in plan view.

2. The manufacturing method according to claim 1, wherein the lead frame has a slope regulation lead, and wherein, in the step (d), the support lead is bent by pushing up the slope regulation lead with the first molding die.

3. The manufacturing method according to claim 1, wherein, before the step (d), the chip mounting portion and the to be covered portion of the support lead are not inclined with respect to the lead frame, and wherein, after the step (d), the chip mounting portion and the to be covered portion of the support lead are inclined with respect to the lead frame.

4. The manufacturing method according to claim 1, wherein sealing body is formed by performing the step (e), wherein a surface of the sealing body in plan view is generally quadrangular, and wherein the support lead extends only in a direction perpendicular to a side of the sealing body in plan view.

5. The manufacturing method according to claim 1, wherein the concave portion has a first side surface located on a chip mounting portion side of the support lead and a second side surface facing the first side surface, and wherein, in the step (a), the first side surface of the concave portion is inclined with respect to the first surface of the lead frame, and the second side surface of the concave portion is not inclined with respect to the first surface of the lead frame.

6. The manufacturing method according to claim 1, wherein in the step (d), the clamping the lead frame with the first and second molding die and thereby bending the support lead at the concave portion as the starting point includes inclining the chip mounting portion and the to be covered portion of the support lead with respect to the upper surface of the first molding die.

7. The manufacturing method according to claim 1, wherein a physical quantity sensor to detect direction in three-dimensional space and acceleration is formed in the semiconductor chip.

8. The manufacturing method according to claim 1, wherein the to be covered portion, the to be exposed portion, and the concave portion are linearly arranged in plan view.

9. The manufacturing method according to claim 1, wherein the concave portion is formed along a width of the lower surface of the support lead.

* * * * *